May 5, 1970 D. L. WOLLESEN 3,510,781
CRYSTAL CONTROLLED AUTODYNE CONVERTER USING FIELD-EFFECT TRANSISTORS
Filed Jan. 3, 1967
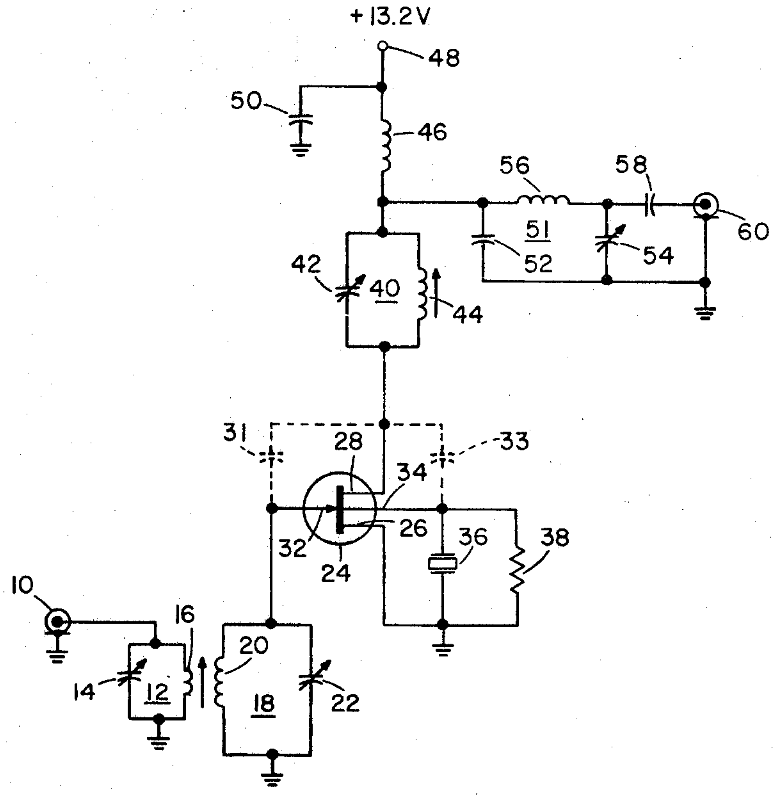
INVENTOR.
Donald L. Wollesen
BY
Mueller, Aichele & Rauner
ATTY'S.

United States Patent Office 3,510,781
Patented May 5, 1970

3,510,781
CRYSTAL CONTROLLED AUTODYNE CONVERTER USING FIELD-EFFECT TRANSISTORS

Donald L. Wollesen, Scottsdale, Ariz., assignor to Motorola, Inc., Franklin Park, Ill., a corporation of Illinois Filed Jan. 3, 1967, Ser. No. 606,703
Int. Cl. H04b 1/28
U.S. Cl. 325—451 4 Claims

ABSTRACT OF THE DISCLOSURE

A mixer circuit having a tetrode field-effect transistor as an active device thereof with the incoming signals being applied to one gate electrode of the field-effect transistor and local oscillations being applied to another gate electrode of said transistor.

This invention relates generally to electronic frequency converters and more particularly to an improved autodyne converter employing a tetrode field-effect transistor (FET) as the active element of the converter and in which signal mixing occurs.

BACKGROUND OF INVENTION

The use of vacuum tubes and bipolar tetrode transistors in mixer circuits is well known. A common mode of mixing in circuits using vacuum tubes and bipolar tetrode transistors is to apply the incoming signal to be frequency converted to one electrode of a transistor or a vacuum tube, apply local oscillations to another electrode thereof and derive sum or difference frequency signals from yet another electrode of the active device. However, known prior art mixers using vacuum tube circuitry are possessed with the disadvantages associated with the tube filament power, and a relatively high distortion content is introduced into the incoming signal by the mixing process. In addition, the interelectrode capacitance of vacuum tubes is far too small to provide the necessary interelectrode coupling from the tube plate to one of the tube grids and thereby provide the necessary excitation for applying local oscillations to a particular grid electrode. This latter characteristic of vacuum tubes makes it necessary to add an external capacitor between electrodes of the vacuum tubes used in some types of mixer circuits in order that sufficient interelectrode capacitance coupling between the tube electrodes is present.

In other known prior art mixer circuits using bipolar tetrode transistors as the active element of the mixer, there is an inherent disadvantage in the fact that neither the incoming signal nor the local oscillator signal which are applied respectively to different electrodes of the bipolar tetrode transistor are capable of turning the bipolar transistor off. Thus, the bipolar tetrode transistor exhibits a very poor switching sensitivity.

It is also well known that certain device analogies exist between a field-effect transistor and a vacuum tube pentode. For example, certain device characteristics such as the current- voltage transfer relationship and a high input impedance are common to both the field-effect transistor and the vacuum tube pentode. However, this device analogy has not led those skilled in the art to construct operative mixer circuits using field-effect transistors and particularly tetrode field-effect transistors and thereby take advantage of the low distortion characteristics of the field-effect transistor. The square-law transfer characteristic of tetrode field-effect transistors introduces negligible distortion components in the signal mixing process and this characteristic makes these devices extremely well suited for use in mixer circuits.

SUMMARY OF THE INVENTION

It is an object of this invention to provide a new and improved mixer circuit which introduces very low harmonic distortion into the incoming signal in the mixing process.

It is another object of this invention to provide a new and improved mixer circuit which requires a low operating power.

The present invention features a mixer circuit wherein signal mixing is produced by applying input RF signals to one gate electrode of a tetrode field-effect transistor, applying local oscillations to another gate electrode of the field-effect transistor and deriving sum or difference IF frequency signals from one of the source or drain electrodes of the field-effect transistor. The field-effect transistor is particularly adaptable for use as an active element of the mixer circuit according to this invention, and the FET requires a low operating power and exhibits excellent low distortion qualities not heretofore obtainable using prior art vacuum tubes and tetrode bipolar transistors. The relatively low interelectrode capacitance from the drain electrode to a first gate electrode to which incoming RF signals are applied prevents any significant undesirable signal coupling between these two electrodes. However, the relatively high interelectrode capacitance between the drain electrode and a second gate electrode to which local oscillations are applied permits excellent interrelectrode coupling between the drain electrode and the second gate electrode; this interelectrode signal coupling is necessary for exciting the local oscillator circuitry which is connected to the second gate electrode of the tetrode field-effect transistor.

Briefly described, the present invention includes a tetrode field-effect semiconductor device having source, drain and first and second gate electrodes and the device is commonly referred to as an FET tetrode. Incoming RF signals to be frequency converted are applied to one of the two gate electrodes of the semiconductor FET device, local oscillations are applied to the other of the two gate electrodes of the device and signal mixing occurs in the FET in accordance with the non-linear square-law transfer characteristic thereof. Sum or difference frequency signals having an extremely low harmonic distortion content may be derived from the source or drain electrodes of the FET tetrode by coupling a tank circuit thereto and tuning the tank circuit to a sum or difference frequency, depending upon the IF frequency desired. A crystal is connected to a second of the two gate electrodes of the FET and provides a high degree of stability for the local oscillations which are applied to this second gate electrode. The above circuit arrangement insures that the autodyne mixer will produce a highly stable IF frequency at the output thereof and this mixer is particularly suitable for converting a 27 megacycle Citizens Band incoming signal to frequencies between approximately 965 kilohertz to 1,2555 magahertz.

DESCRIPTION OF DRAWING

The novel field-effect transistor mixer circuit according to this invention is illustrated in the accompanying drawing in a schematic diagram of the single circuit embodiment thereof.

DESCRIPTION OF PREFERRED EMBODIMENT

Referring in detail to the drawing, there is shown a circuit embodiment of this invention having an input terminal 10 which is connected to an input LC tank circuit 12 including variable capacitor 14 and inductor 16. The tank circuit 12 is tuned to resonate at the RF frequency of the incoming signal. A mixer LC tank circuit 18 including a variable capacitor 22 and an inductor 20 is also tuned to resonate at the incoming RF frequency, and the signal at the output of the tank circuit 18 is coupled to a first gate electrode 32 of the junction field-effect tetrode 24. The junction FET 24 further includes source electrode 26 which is connected to ground potential and a drain electrode 28 from which local oscillator signal and the IF signal are derived using an LC tank circuit 40.

A second gate electrode 34 is connected to a crystal 36 which is tuned to a desired local oscillation frequency, and a gate bias resistor 38 is connected as shown between the second gate electrode and ground potential. The interelectrode capacitance 31 between the drain electrode 28 and the first gate electrode 32 is very small, in the order of 0.3 picofarad so there is very little signal coupling between these two electrodes. However, the interelectrode capacitance 33 between the drain electrode 28 and the second gate electrode 34 is relatively high, in the order of 2.0 picofarads and provides excellent signal coupling from the drain to the second gate electrode. This interelectrode coupling is necessary for exciting the crystal 36 and producing local oscillations on the second gate electrode 34. It is easy to obtain field-effect tetrodes having the above-described interelectrode capacitance characteristics due to the differences in areas of the substrate gate and the gate opposing the substrate gate on the other side of the channel. The relatively large surface area intermediate the substrate gate and the drain region gives a relatively large capacitance between substrate gate and drain electrodes so the crystal 36 is connected to the latter gate. On the other hand, the relatively small area between the drain region and the gate opposing the substrate gate is responsible for relatively small capacitance between this gate and the drain electrode; accordingly, the incoming signals are coupled to this last named gate electrode.

An output tank circuit 40 which is connected to the drain electrode 28 of the FET 24 includes capacitor 42 and inductor 44 which are tuned to resonate at a frequency slightly higher than the frequency of local oscillations. This tuning satisfies the phase shift requirements for a "tuned plate-turned grid" oscillator. An inductance-capacitance filter network 51 consisting of shunt capacitors 52 and 54 which are interconnected by a series inductor 56 provides the necessary output low pass filtering action for the mixer circuit. An output DC blocking capacitor 58 is connected between the output of the low pass filter 51 and an output terminal 60.

The junction FET 24 is connected to a voltage supply terminal 48 through a high frequency choke coil 46, and an AC filter capacitor 50 is connected between the voltage supply terminal 48 and ground potential to prevent any high frequency signals from entering the voltage supply.

Either the incoming signals which are applied to the first gate electrode 32 or the local oscillations which are applied to the second gate electrode 34 are capable of turning off the junction FET 24, and this feature of the junction FET 24 makes it extremely well suited as the active device in the mixer circuit. Such switching action is not possible using bipolar transistor tetrodes. The relatively high interelectrode capacitance represented at 33 permits excellent drain-to-second gate coupling for exciting the crystal 36 and producing local oscillations on the second gate without the necessity of having an external capacitor in the circuit for this purpose. This feature is not available in vacuum tube mixer circuitry. However, the relatively low interelectrode capacitance represented at 31 permits only a negligible degree of interelectrode signal coupling between the drain electrode and the first gate electrode, and it is desirable that this latter interelectrode capacitance feedback be maintained at a minimum.

The crystal 36 may be tuned to a desired local oscillation frequency and provides a high degree of stability in the mixer circuit, but a less stable LC tank circuit may be substituted therefor if desired without departing from the scope of this invention.

The following table is presented to identify some of the actual component values used in a mixer circuit of the type shown in the drawing which was actually built and successfully tested. However, these values should not be construed as limiting the scope of this invention.

TABLE

| Resistor | | Value |
|---|---|---|
| C14 | picofarads | 80–480 |
| R38 | megohm | 1 |
| Capacitors | | |
| C14 | picofarads | 80–480 |
| C22 | do | 2–50 |
| C31 (interelectrode) | [1] approximately | [1] 0.3 |
| C33 (interelectrode) | do | [1] 2.0 |
| C42 | do | 2–50 |
| C50 | microfarads | 0.1 |
| C52 | picofarads | 27 |
| C54 | do | 50–80 |
| C58 | microfarads | 0.001 |
| Inductors | | |
| L46 | microhenrys | 180 |
| L56 | do | 100 |
| Supply voltage (terminal 48) | volts | 13.2 |

The inductors 16, 18 and 46 were hand wound and their actual values are not available.

It will be appreciated by those skilled in the art that the converter circuit according to this invention is not limited to junction field-effect transistors and may be operated equally well with isolated gate field-effect transistors.

What I claim is:

1. A mixer circuit including in combination, tetrode field effect transistor means having source and drain electrodes and first and second gate electrodes, said tetrode field effect transistor means further having a given interelectrode capacitance between said first gate electrode and said drain electrode and having interelectrode capacitance between said second gate electrode and said drain electrode which is substantially greater than said given interelectrode capacitance, input circuit means connected to said first gate electrode for receiving incoming radio frequency signals and applying the same to said first gate electrode, frequency selective means connected to said second gate electrode, said greater electrode capacitance providing the sole feedback coupling between said second gate electrode and said drain electrode, said frequency selective means cooperating with the signal fed back through said greater interelectrode capacitance between said drain electrode and said second gate electrode to generate local oscillations which appear at said second gate electrode, said tetrode field effect transistor means mixing said local oscillations with said incoming radio frequency signals to produce intermediate frequency signals at said drain electrode, and output circuit means coupled to said drain electrode for deriving an intermediate frequency signal therefrom.

2. The mixer circuit of claim 1 wherein said given interelectrode capacitance between said first gate electrode and said drain electrode is of the order of 0.3 picofarad and said substantially greater interelectrode capacitance between said second gate electrode and said drain electrode is of the order of 2.0 picofarads.

3. The mixer circuit of claim 1 wherein said frequency selective means connnected to said second gate electrode includes crystal means which resonates at the desired frequency of local oscillation, with said crystal means being excited by signals coupled thereto solely through said greater interelectrode capacitance between said drain electrode and said second gate electrode.

4. The mixer circuit of claim 3 further including resistive means connected in parallel with said crystal means thereby biasing said second gate electrode of said tetrode field effect transistor means so that said local oscillations applied to said second gate electrode render said tetrode field effect transistor means alternately conducting and nonconducting.

References Cited

UNITED STATES PATENTS 3,348,154 10/1967 Fish ---------------- 325—451
3,348,155 10/1967 Von Recklinghausen -- 325—451

ROBERT L. GRIFFIN, Primary Examiner

A. J. MAYER, Assistant Examiner